United States Patent [19]

Koch et al.

[11] Patent Number: 4,869,997

[45] Date of Patent: Sep. 26, 1989

[54] COATING PLATE CYLINDERS OR SLEEVES WITH A CONTINUOUS PHOTOSENSITIVE RECORDING LAYER

[75] Inventors: Horst Koch, Gruenstadt; Helmut Bach, Mutterstadt; Klaus-Peter Jaeckel, Ludwigshafen, all of Fed. Rep. of Germany

[73] Assignee: BASF Aktiengesellschaft, Ludwigshafen, Fed. Rep. of Germany

[21] Appl. No.: 153,932

[22] Filed: Feb. 9, 1988

[30] Foreign Application Priority Data

Feb. 14, 1987 [DE] Fed. Rep. of Germany ....... 3704694

[51] Int. Cl.[4] .................................................. G03F 7/18
[52] U.S. Cl. ..................................... 430/300; 430/306; 430/494; 430/935
[58] Field of Search ............... 430/270, 273, 300, 306, 430/307, 935, 494, 275, 278

[56] References Cited

U.S. PATENT DOCUMENTS

| | | | |
|---|---|---|---|
| 3,046,156 | 7/1962 | Kaulen | 430/935 X |
| 3,210,187 | 10/1965 | Thommes | 430/271 |
| 3,241,973 | 3/1966 | Thommes | 430/271 |
| 3,259,499 | 7/1966 | Thommes | 430/273 |
| 3,408,191 | 10/1968 | Jeffers | 430/253 |
| 4,087,182 | 5/1978 | Aiba et al. | 355/100 |
| 4,337,220 | 6/1982 | Arimatsu | 264/15 |
| 4,539,287 | 9/1985 | Grossa et al. | 430/300 |

FOREIGN PATENT DOCUMENTS

| | | |
|---|---|---|
| 0040893 | 12/1981 | European Pat. Off. . |
| 0043623 | 1/1982 | European Pat. Off. . |
| 0104954 | 4/1984 | European Pat. Off. . |
| 0111371 | 6/1984 | European Pat. Off. . |
| 0168636 | 1/1986 | European Pat. Off. . |
| 1345015 | 10/1963 | France . |
| 2391072 | 12/1978 | France . |
| 57-4047 | 1/1982 | Japan . |
| 58-160956 | 9/1983 | Japan . |
| 8501052 | 11/1986 | Netherlands . |
| 545942 | 6/1942 | United Kingdom . |
| 1579817 | 11/1980 | United Kingdom . |

OTHER PUBLICATIONS

IBM Technical Disclosure vol. 15, No. 2, Jul. 1972, pp. 654, 46

*Primary Examiner*—Jose G. Dees
*Attorney, Agent, or Firm*—Keil & Weinkauf

[57] ABSTRACT

A printing cylinder or a sleeve is coated with a continuous photosensitive recording layer by applying a first jointless stratum of a photosensitive recording layer to the printing cylinder or the sleeve, and uniformly preexposing this first stratum to actinic light and thereafter applying one or more further jointless strata of the photosensitive recording layer to this preexposed first stratum.

4 Claims, No Drawings
}

COATING PLATE CYLINDERS OR SLEEVES WITH A CONTINUOUS PHOTOSENSITIVE RECORDING LAYER

The present invention relates to a process for coating plate cylinders or sleeves with a jointless, continuous, photosensitive, in particular photopolymerizable, recording layer, where the printing cylinders or sleeves coated in this manner should be suitable for the production of rotary printing plates.

Processes for coating, in particular continuous coating, of printing cylinders or sleeves with a photosensitive, in particular photopolymerizable, recording layer are known per se. In addition to direct methods for the production of continuous coatings, for example solution coating and ring extrusion, the processes described in particular for this purpose are those in which a prefabricated, solid thermoplastically processible photosensitive layer is wrapped around a printing cylinder or a sleeve, and the abutting edges of the end and/or lateral areas of the photosensitive layer are welded to one another under the influence of heat and/or pressure and with the production of a continuously joined, seamless photosensitive layer. The relevant prior art includes, for example, DE-B-27 22 896, DE-A-28 42 440, DE-A-28 44 426, DE-A-29 11 908, DE-A-31 25 564, EP-A-40 893, EP-A-43 623 and EP-A-111 371. The printing cylinders or sleeves continuously coated in this way with a continuous photosensitive recording layer can be converted, by imagewise exposure to actinic light and development, into printing cylinders or sleeves for rotary printing, which are suitable, for example, for flexographic printing or gravure printing, in particular for printing continuous images on web-fed presses. The disadvantage of the known procedures is that the conventional preexposure of the photosensitive recording layer from the back, as described in, for example, US-A 3 210 187, US-A 3 259 499 or US-A 3 408 191, is not possible.

In negative-working materials, the conventional uniform preexposure of photosensitive recording layers from the back is known to lead to photocrosslinking of the lower part of the recording layer, before imagewise crosslinking is effected in the exposed parts of the remaining uncrosslinked layer by a principal imagewise exposure from the front; after development, for example washing out of the remaining imagewise exposed layer, the said imagewise crosslinking permits formation of the relief structure intended for printing. Because the thickness of the remaining uncrosslinked recording layer is thinner, but sufficient for the relief structure, the preexposure from the back makes it possible significantly to reduce the time required for the principal imagewise exposure and to achieve satisfactory shadow well depths of the relief structure and good support for even fine relief elements of the developed print relief. If preexposure from the back is not carried out, longer times are required for the principal imagewise exposure in order to achieve adequate support of fine relief elements, which easily leads to closing of the shadow well depths in fine negative image elements.

Whereas uniform preexposure of the photosensitive recording layer from the back is completely impossible where plate cylinders or sleeves are continuously coated by solution coating or ring extrusion, it leads to difficulties when the prefabricated, solid, photosensitive recording layer is applied to a plate cylinder or a sleeve. At the abutting edges of the recording layer which has been uniformly preexposed from the back, the layer material can no longer be satisfactorily welded, as is advantageous and necessary for the production of continuously coated printing cylinders or sleeves, since it is known that only an uncrosslinked polymer layer can be satisfactorily welded, but not an exposed, crosslinked polymer layer. Furthermore, a crosslinked polymer layer has substantially poorer adhesion to the printing cylinder or sleeve with which it is in contact. Because it is impossible to preexpose from the back printing cylinders or sleeves provided with continuous photosensitive recording layers, or prefabricated, photosensitive recording layers prior to application to printing cylinders or sleeves, it is therefore generally impossible to obtain the same low tonal values during printing, compared with corresponding flat photosensitive printing plates which permit preexposure from the back, when rotary printing plates which have been produced from such printing cylinders or sleeves coated with photosensitive recording layers are used.

It is an object of the present invention to avoid the disadvantages of the prior art and provide a process which leads to printing cylinders or sleeves which are continuously coated with a photosensitive recording layer and, with the use of shorter exposure times, are suitable for the production of rotary printing plates having well defined relief structure even in the case of fine relief components and negative image elements.

In the copending U.S. patent application Ser. No. 009,804, filed Jan. 30, 1987, of the same assignee, it has been proposed in this connection to apply a photosensitive recording layer which has been subjected to screen-like preexposure from the back beforehand onto the printing cylinder or the sleeve, so that, in the rear or lower level of the layer, only discrete volume element or parts are photocrosslinked or photopolymerized by the preexposure and uncrosslinked or polymerizable layer material still remains in between in the rear level of the layer.

We have found that this object is achieved and the disadvantages described above can be avoided if a photosensitive recording layer is applied to the printing cylinder or the sleeve in a plurality of strata in succession, in a first step the printing cylinder or the sleeve being coated with a first, jointless stratum of a photosensitive recording layer, this first stratum then being preexposed uniformly to actinic light and thereafter one or more further jointless strata of the same or of another photosensitive recording layer being applied, without bubbles, onto this preexposed first stratum.

The present invention accordingly relates to a process for coating a printing cylinder or a sleeve with a jointless, continuous photosensitive recording layer, wherein the printing cylinder or the sleeve is first coated with a first jointless stratum of a photosensitive recording layer, this first stratum is then preexposed uniformly to actinic light and thereafter one or more further jointless strata of the same or of another photosensitive recording layer are applied, without bubbles, onto this preexposed first stratum.

The novel process is not restricted only to the coating of printing cylinders or sleeves by applying a prefabricated, solid photosensitive layer, but is widely and generally applicable. The printing plates produced from the products in a conventional manner can be used to produce high quality prints, including those having low tonal values, in long print runs by rotary printing.

All photosensitive recording layers which are known per se and have been described and which can be processed to printing plates by imagewise exposure to actinic light and development are suitable for use in the novel process. Particular examples here are the positive-working or negative-working photosensitive photopolymerizable recording layers. Suitable photopolymerizable recording layers generally contain one or more polymeric binders, for example soluble nylons, partially hydrolysed polyvinyl acetates, plasticized or unplasticized polyvinyl alcohols or polyvinyl alcohol derivatives, polyurethanes, diene polymers, for example block copolymers of styrene, butadiene and/or isoprene, or butadiene/acrylonitrile copolymers, one or more low molecular weight, ethylenically unsaturated photopolymerizable compounds, for example the known monomers containing (meth)acrylate or (meth)acrylamide groups, one or more photopolymerization initiators, for example benzoin ethers, benzil monoketals or acylphosphine oxides, and conventional additives and/or assistants, for example thermal polymerization inhibitors, dyes, pigments, fillers, plasticizers, leveling agents, sensitometric regulators, etc. The photosensitive, photopolymerizable recording layers as known and described for the production of flexographic printing plates or gravure printing plates are particularly suitable for the novel process (cf. for example DE-A-22 15 090, DE-A-29 02 412, EP-B-27 612, DE-A-20 61 287, EP-A-70 510, EP-A-70 511). Preferably, solid photosensitive recording layers which can be processed and shaped by a thermoplastic method are used in the novel process. These include, in particular, solid, polymeric photosensitive recording layers which are conventionally used for the production of printing and relief plates and which soften on heating and flow or stick under pressure.

Particularly suitable printing cylinders or sleeves for the novel process are the cylinders and cylindrical sleeves, including conical sleeves, which are known to be used for continuous coating with photosensitive recording layers for the production of cylindrical printing plates for rotary printing. While the printing cylinders usually consist of metal, the sleeves may be composed of metal, plastics, glass fiber-reinforced plastics or the like. To achieve good adhesion between the printing cylinder or sleeve on the one hand and the photosensitive recording layer on the other hand, printing cylinders or sleeves whose surface is roughened or provided with an adhesion-promoting layer are advantageously used.

According to the invention, in a first step, a first jointless, ie. continuous, stratum of a photosensitive recording layer of the type under discussion is applied to the printing cylinder, which may or may not have been pretreated, or the sleeve, which may or may not have been pretreated. This can be done, for example, by solution coating using a conventional ring coating unit, vaporizing the solvent and, if necessary, drying the layer, or by melt coating, for example using a conventional ring extrusion coating unit. As a rule, however, a prefabricated, solid, preferably base-free, thermoplastically processible photosensitive recording layer is used as the starting material for applying the first stratum of the photosensitive recording layer to the printing cylinder or the sleeve. The said recording layer can be applied to the printing cylinder or the sleeve in a first layer, firmly and with formation of a jointless, continuous stratum of the photosensitive recording layer, by the conventional techniques, for example those described in the prior art cited above. For this purpose, the prefabricated photosensitive recording layer, cut to size and tailored to fit the cylinder circumference, is applied and fixed on the printing cylinders or sleeves which are unpretreated or pretreated, precoated or covered with a knitted textile fabric, so that, after the printing cylinder or the sleeve has been wrapped with a stratum of the photosensitive recording layer, its cut edges abut one another after which the abutting edges of the photosensitive recording layer applied in this manner are fused together at elevated temperatures, preferably at from 40° to 200° C., in particular from 80° to 150° C., with simultaneous or subsequent application of pressure. The pressure is preferably generated by applying reduced pressure between the printing cylinder or sleeve and the photosensitive recording layer or a plastic film or shrink film covering the said layer, by the procedures disclosed in the prior art cited above. However, it is also possible to use other techniques for applying a prefabricated thermoplastically processible photosensitive layer to a printing cylinder or a sleeve, provided that this technique produces, on the printing cylinder or sleeve, a first continuously joined stratum of the photosensitive recording layer, the said stratum being firmly bonded to the sleeve and its photosensitive properties not being adversely affected by application to the printing cylinder or the sleeve.

In the next step of the novel process, this first, jointless stratum of the photosensitive recording layer, which stratum has been applied to the printing cylinder or to the sleeve, is subjected to uniform exposure to actinic light. This uniform exposure of the first stratum of the photosensitive recording layer can be carried out in the presence or absence of atmospheric oxygen. The exposure time for this uniform exposure is preferably chosen so that this first stratum of the photosensitive recording layer is still capable of further photoreactions after this uniform exposure. Usually, and advantageously, this uniform exposure of the first stratum of the photosensitive recording layer is carried out similarly to a preexposure, especially regarding the duration and intensity of the exposure, ie. the duration and type of the uniform exposure are chosen, in particular, to correspond to the conditions of an otherwise conventional preexposure of a corresponding photosensitive recording layer from the back. The times for the uniform exposure of the first stratum of the said layer are typically from about 5 to 50 minutes, depending on the type of photosensitive recording material, the thickness of the first stratum of the photosensitive layer, the light source used, the desired property profile of the final products, etc.

According to the invention, one or more further jointless strata of an unexposed photosensitive recording layer are applied to the photosensitive recording layer in a subsequent step. The photosensitive recording layers of the abovementioned type are also used for this further stratum or these further strata. The individual strata of the said layer which are to be applied, according to the invention, to the printing cylinder or the sleeve may have identical or different compositions, in the unexposed state. A further stratum or further strata of the photosensitive recording layer can be applied to the preexposed first layer by the techniques used to apply the first layer, in the unexposed state, to the printing cylinder or the sleeve, ie. suitable methods for this purpose are the indirect methods for producing a continuous coating, for example solution coating or ring extrusion, and in particular the indirect methods in which the starting material used is a prefabricated solid, base-free photosensitive recording layer generally trimmed to the cylinder circumference, whose said recording layer is applied to the first preexposed layer and then converted to a jointless, continuous stratum by joining or welding the abutting edges.

What is important is that the application of the second and, where relevant, all further strata of the photosensitive recording layer to the first, preexposed stratum is carried out without bubbles and avoiding enclosed air between the individual strata. When prefabricated, solid photosensitive recording layers are used to form the further strata, this requirement can be met, for example, by pressing the prefabricated photosensitive layer forming the further stratum against the particular lower stratum of the photosensitive recording layer, for example by means of a roll, with displacement of air. In order to ensure and maintain a close fit, the presence of a laminating assistant and/or, in particular, the use of heat may be advisable and useful. To avoid enclosed air between the individual strata, it has likewise proven useful, for example, first to apply a fabric to the first, preexposed stratum before applying the second stratum of the unexposed photosensitive recording layer on top of this.

The second and, where relevant, all further strata of the unexposed photosensitive recording layer are applied to the first, preexposed stratum in such a way that a firm bond forms between the individual strata. In general, heat and/or pressure are employed for this purpose. This can be done, for example, by means of hot calendering, or the printing cylinders or sleeves coated with the strata of the photosensitive recording layer can be wrapped in a gas-tight plastic film or shrink film and then heated under reduced pressure. It was extremely surprising that, in the novel process, a very good and firm bond between the first, preexposed crosslinked stratum of the recording layer and the subsequently applied second stratum of the unexposed photosensitive recording material forms without the use of adhesion-promoting layers, in view of the fact that experience had shown that prefabricated photosensitive recording layers preexposed uniformly from the back are not very suitable, if at all, for coating printing cylinders or sleeves with a continuous, photosensitive recording layer.

The total thickness of the photosensitive recording layer applied to the printing cylinder or to the sleeve depends primarily on the intended use of the printing cylinders or sleeves coated in this manner. For the production of rotary printing plates, the photosensitive recording layer formed from the individual strata usually has a total thickness of from about 200 μm to about 6 mm. For the production of gravure printing plates, thinner layers are generally sufficient, whereas for the production of rotary printing plates for flexographic printing the said recording layer generally has a total thickness of from about 1 to 6 mm. The first stratum of the photosensitive recording layer, which stratum, according to the invention, is first applied and then uniformly preexposed, generally accounts for about 20–80%, in particular about 35–70%, of the thickness of the total photosensitive recording layer formed from the individual strata. The ratio of the thickness of the first preexposed stratum to the thickness of all further unexposed strata of the photosensitive recording layer is determined, inter alia, by the total thickness of the photosensitive recording layer, the type of photosensitive recording material, the desired exposure times and relief-forming properties of the novel product and similar parameters familiar to the skilled worker.

According to the invention, a further jointless stratum of the photosensitive recording layer is preferably applied to the first jointless stratum of the photosensitive recording layer after the uniform exposure, in particular the photosensitive recording material being identical for the two strata, in the unexposed state.

The jointless photosensitive recording layer applied in two or more strata to the printing cylinders or sleeves by the novel process can subsequently be further subjected to a shaping aftertreatment, for example by cutting, turning, grinding or the like, to obtain the exact dimensions. Such a shaping aftertreatment serves primarily to produce an exactly dimensioned, uniform, seamless outer surface of the photosensitive recording layer. It compensates any slight fluctuations in layer thickness and produces an exactly cylindrical periphery, which is particularly important when conical sleeves are used. Furthermore, the surface of the photosensitive recording layer can finally be smoothed in a conventional manner and/or, if necessary, provided with a cover sheet or protective layer.

The printing cylinders or sleeves coated with a jointless, continuous photosensitive recording layer by the novel process can be converted in a conventional manner, by imagewise exposure to actinic light, development of the relief structure, for example by washing out with a suitable developer, and, if necessary, aftertreating, for example by drying or postexposure, into printing plates for rotary printing, in particular for web-fed presses. Compared with the printing cylinders or sleeves coated by conventional procedures with a jointless photosensitive recording layer, the novel products make it possible to achieve shorter exposure times and better relief structures, which is particularly important for the reproduction of fine image elements and low tonal values.

The Examples wich follow illustrate the invention.

EXAMPLE 1

A 2.71 mm thick photosensitive recording layer which contained an A-B-C block copolymer with a polystyrene, a polyisoprene and a styrene/isoprene copolymer block as the binder, di(meth)acrylates as monomers, benzil dimethyl ketal as the photoinitiator, a black dye and a commercial α-methylstyrene/vinyltoluene copolymer and had been prepared by kneading the components at 140° C. and then calendering the product between two polyester films was applied to a nickel sleeve, as described in Example 1 of EP-A-111 371, and the abutting edges were fused at 150° C., so that a uniform, jointless surface was formed. Thereafter, the photosensitive layer was exposed in the presence of atmospheric oxygen for 20 minutes in a flat-plate exposure unit. A 1.17 mm thick photopolymerizable recording layer which had the same composition as the first layer was then laminated with this exposed layer, and the abutting edges were likewise fused at 150° C. until a uniform surface was formed. By dipping the nickel sleeve coated in this manner with two strata of the photosensitive recording layer into a solution of nylon, a protective layer about 5 μm thick was applied to the surface of the photosensitive recording layer, so that a tack-free surface resulted. The coated nickel sleeve was then applied to a printing cylinder, and the photosensitive recording layer then exposed imagewise to actinic light for 15, 20, 30 and 35 minutes. Washing out with a developer and drying (for 60 minutes at 60° C.) gave a relief plate which, after bromine treatment to reduce the surface tack, was also postexposed for 10 minutes in a flat-bed exposure unit. The properties of the relief produced are listed in the Table. The relief plate thus produced was very suitable as a flexographic printing plate for rotary printing.

EXAMPLE 2

The procedure described in Example 1 was followed, except that in this case the first stratum of the photosensitive recording layer was exposed for 20 minutes in the absence of atmospheric oxygen after application to the nickel sleeve. The results obtained are likewise shown in the Table.

COMPARATIVE EXAMPLE

A photosensitive recording layer having the same composition as in Example 1 but with a thickness of 3.88 mm was applied to a nickel sleeve as described in Example 1 of EP-A-111 371 and the abutting edges were fused at 150° C. so that a uniform jointless surface was formed. The coated sleeve thus obtained was provided, as described in Example 1, with a nylon protective layer, and processed to give a relief plate. The results obtained are likewise shown in the Table.

We claim:

1. A process for coating a printing cylinder or sleeve with a continuous photosensitive recording layer which comprises:
   coating the printing cylinder or the sleeve with a first jointless stratum of the photosensitive recording layer;
   uniformly pre-exposing the first stratum to actinic light;
   applying to the pre-exposed first stratum one or more prefabricated, base-free, solid, thermoplastically processable jointless recording layers, while avoiding enclosing air between the individual strata, and
   fusing the abutting edges of the applied recording layers to provide a uniform surface.

2. The process of claim 1, wherein the prefabricated recording layers are pressed against the previously applied stratum of the photosensitive recording layer with the displacement of air to form a firm bond between the strata of the recording layer.

3. The process of claim 1, wherein the second stratum of the photosensitive recording layer, which stratum is applied to the uniformly preexposed first stratum, has the same composition as the first stratum in the unexposed state.

4. The process of claim 1, wherein the first stratum of the photosensitive recording layer accounts for about 35–70% of the thickness of the total photosensitive recording layer.

* * * * *

TABLE

|  | Example 1 | Example 2 | Comparative Example |
| --- | --- | --- | --- |
| Shore A | 46 | 46 | 44–45 |
| Relief depth | 1200 μm | 1180 μm | 1240 μm |
| Required exposure time to form an isolated dot 0 = 200 μm | 25 min. | 20 min. | 35 min. |
| Required exposure time to form an isolated dot 0 = 400 μm | 15 min. | 15 min. | *<br>Dots cannot be evaluated |
| Required exposure time of a screen with 2% tonal value and 48 lines/cm | 30 min. | 35 min. |  |
| Required exposure time of a screen with 3% tonal value and 48 lines/cm | 20 min. | 25 min. |  |
| Required exposure time of a screen with 5% tonal value and 48 lines/cm | 15 min. | 15 min. |  |
| Relief depth of a 400 μm negative dot after exposure for 15 minutes | 65 | 53 | Not measurable |
| Relief depth of a 400 μm negative dot after exposure for 20 minutes | 57 | 39 | Not measurable |
| Relief depth of a 400 μm negative dot after exposure for 25 minutes | 33 | 55 | Not measurable |
| Relief depth of a 400 μm negative dot after exposure for 30 minutes | 32 | 50 | Not measurable |
| Relief depth of a 400 μm negative dot after exposure for 35 minutes | 32 | 7 | Not measurable |

*Boundaries of the dots exhibit a pronounced bead